(12) United States Patent
Peng

(10) Patent No.: US 12,342,487 B2
(45) Date of Patent: Jun. 24, 2025

(54) PROTECTIVE FILM ASSEMBLY FOR FOLDABLE SCREEN, PROTECTIVE SHELL AND TERMINAL

(71) Applicant: BEIJING XIAOMI MOBILE SOFTWARE CO., LTD., Beijing (CN)

(72) Inventor: Cong Peng, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 544 days.

(21) Appl. No.: 17/877,847

(22) Filed: Jul. 29, 2022

(65) Prior Publication Data

US 2023/0309250 A1    Sep. 28, 2023

(30) Foreign Application Priority Data

Mar. 23, 2022    (CN) .......................... 202210293825.1

(51) Int. Cl.
*H05K 5/03*    (2006.01)
*H04M 1/02*    (2006.01)

(52) U.S. Cl.
CPC ............. *H05K 5/03* (2013.01); *H04M 1/0216* (2013.01); *H04M 1/0268* (2013.01)

(58) Field of Classification Search
None
See application file for complete search history.

(56) References Cited

FOREIGN PATENT DOCUMENTS

| CN | 209748968 U | | 12/2019 |
|---|---|---|---|
| CN | 209750104 | * | 12/2019 |
| CN | 209750104 U | | 12/2019 |

OTHER PUBLICATIONS

Extended European Search Report of EP Application No. 22187809.3 dated Aug. 16, 2023, (7p).

* cited by examiner

*Primary Examiner* — Yan Lan
(74) *Attorney, Agent, or Firm* — Arch & Lake LLP

(57) ABSTRACT

A protective film assembly for a foldable screen, including: a fixing portion for being disposed at a side edge of the terminal parallel to a crease of the foldable screen; and a film body for covering the foldable screen. An accommodating cavity is inside the fixing portion, and the film body is configured to at least partially retract into the accommodating cavity in a direction perpendicular to the crease in case that the foldable screen is folded. The film body is configured to extend out of the accommodating cavity in a direction perpendicular to the crease to cover the foldable screen in case that the foldable screen is unfolded.

20 Claims, 3 Drawing Sheets

PROTECTIVE FILM ASSEMBLY FOR FOLDABLE SCREEN, PROTECTIVE SHELL AND TERMINAL

CROSS REFERENCE TO RELATED APPLICATION

The present application claims the benefit of priority to Chinese Application No. 202210293825.1 filed on Mar. 23, 2022, the contents of which are incorporated herein by reference in their entireties for all purposes.

BACKGROUND

With the continuous development of terminals, more and more functions appear in the vision of people. For example, mobile phones take on more and more functions, and various tasks can be completed through mobile phones. Due to the foldable characteristics, a foldable screen has become popular among many companies in recent years. Since the foldable screen has a larger display area when unfolded, and has foldable characteristics so as to be portable. The unique advantages bring more possibilities to the use of a device. With the advent of the foldable screen, a protective film suitable for the foldable screen is correspondingly produced to protect the screen of the foldable screen.

SUMMARY

The disclosure relates to the technical field of terminals, and in particular, to a protective film assembly for a foldable screen, a protective shell and a terminal.

An example of the disclosure provide a protective film assembly for a foldable screen, including: a fixing portion, for being disposed at a side edge of a terminal parallel to a crease of the foldable screen; and a film body, for covering the foldable screen, an accommodating cavity is formed inside the fixing portion, and the film body is configured to at least partially retract into the accommodating cavity in a direction perpendicular to the crease when the foldable screen is folded, and to extend out of the accommodating cavity in the direction perpendicular to the crease to cover the foldable screen when the foldable screen is unfolded.

An example of the disclosure further provide a protective shell, including an housing for coating the periphery of a frame of a terminal and a protective film assembly for a foldable screen, the protective film assembly includes: a fixing portion, for being disposed at a side edge of a terminal parallel to a crease of the foldable screen; and a film body, for covering the foldable screen, an accommodating cavity is formed inside the fixing portion, and the film body is configured to at least partially retract into the accommodating cavity in a direction perpendicular to the crease when the foldable screen is folded, and to extend out of the accommodating cavity in the direction perpendicular to the crease to cover the foldable screen when the foldable screen is unfolded.

An example of the disclosure further provide a terminal, including a protective film assembly for a foldable screen, the protective film assembly includes: a fixing portion, for being disposed at a side edge of a terminal parallel to a crease of the foldable screen; and a film body, for covering the foldable screen, an accommodating cavity is formed inside the fixing portion, and the film body is configured to at least partially retract into the accommodating cavity in a direction perpendicular to the crease when the foldable screen is folded, and to extend out of the accommodating cavity in the direction perpendicular to the crease to cover the foldable screen when the foldable screen is unfolded.

BRIEF DESCRIPTION OF THE DRAWINGS

The accompanying drawings, which are incorporated in and constitute part of the description, illustrate examples consistent with the disclosure and, together with the description, serve to explain principles of the disclosure.

DETAILED DESCRIPTION

Figure 1:
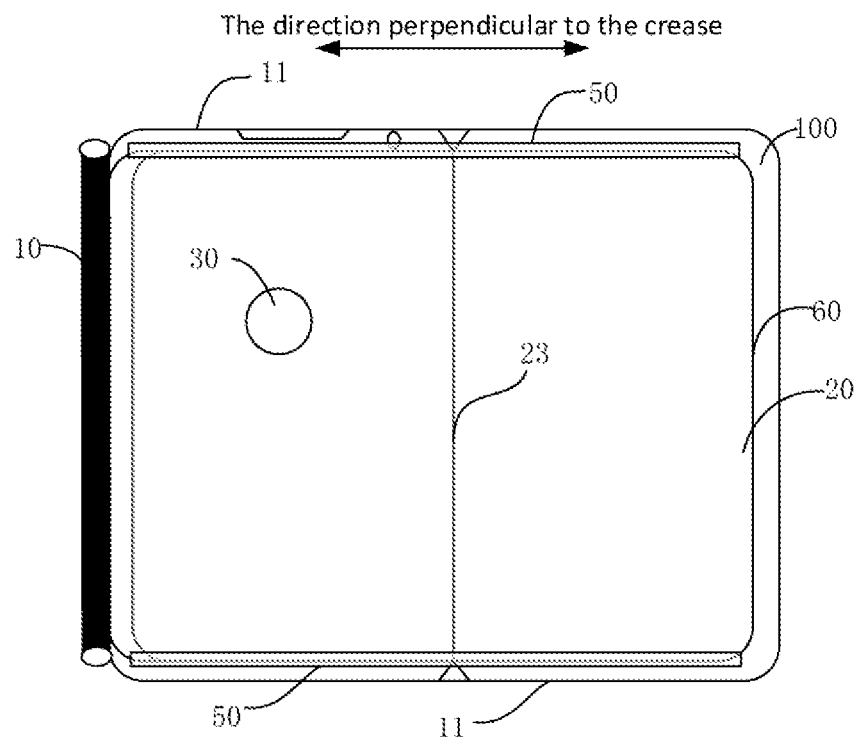
FIG. 1 is a schematic structural diagram of a foldable screen when unfolded according to an example.
Figure 2:
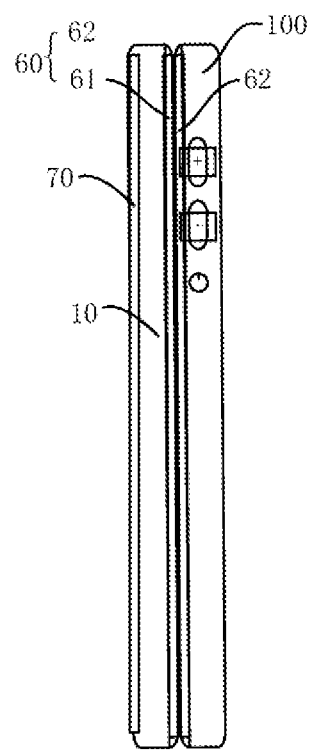
FIG. 2 is a schematic structural diagram of a foldable screen when folded according to the example shown in FIG. 1.

Examples will be described in detail here, and the examples are illustrated in the accompanying drawings. In the disclosure, in the absence of an opposite description, directional words such as "inner, outer" are used for the contours of the corresponding components; terms used in the disclosure such as "first, second" are meant to distinguish one element from another, and have no order and importance. Additionally, when the following description refers to the accompanying drawings, unless otherwise stated, the same numbers in different drawings represent the same or similar elements. The implementations described in the following examples do not represent all implementations consistent with the disclosure. Conversely, they are merely examples of apparatuses and methods consistent with some aspects of the disclosure and as detailed in the appended claims.

It should be understood that the expression "one element/structure/component is on/below/in front of/behind/on the side of another element/structure/component" should be construed in a broad sense, for example, the one element may by directly disposed on/below/in front of/behind/on the side of the another element or indirectly disposed on/below/in front of/behind/on the side of the another element through an Intermediate element, and the two elements may be in contact, connected or integrated.

Reference throughout this specification to "one embodiment," "an embodiment," "an example," "some embodiments," "some examples," or similar language means that a particular feature, structure, or characteristic described is included in at least one embodiment or example. Features, structures, elements, or characteristics described in connection with one or some embodiments are also applicable to other embodiments, unless expressly specified otherwise.

It should be understood that although terms "first", "second", "third", and the like are used in the present disclosure to describe various information, the information is not limited to the terms. These terms are merely used to differentiate information of a same type. For example, without departing from the scope of the present disclosure, first information is also referred to as second information, and similarly the second information is also referred to as the first information. Depending on the context, for example, the term "if" used herein may be explained as "when" or "while", or "in response to . . . , it is determined that".

The disclosure provides a protective film assembly for a foldable screen, a protective shell and a terminal.

Referring to FIG. 1 to FIG. 4, according to a first aspect of an example of the disclosure, a protective film assembly for a foldable screen 60 is provided, the protective film assembly includes a fixing portion 10 and a film body 20. The fixing portion 10 is used to be arranged at a side edge of a terminal parallel to a crease 23 of the foldable screen 60. The crease 23 refers to a folding line where the foldable screen 60 is folded, and the crease 23 may refer to a virtual crease 23. The film body 20 is used to cover the foldable screen 60 to protect the foldable screen 60. The film body 20 may be arranged on the fixing portion 10, or the film body 20 may be arranged on the terminal by means of other structures. In an example of the disclosure, an accommodating cavity 101 may be formed inside the fixing portion 10, and the film body 20 is configured to: when the foldable screen 60 is folded, at least part of the film body 20 can retract into the accommodating cavity 101 in a direction perpendicular to the crease 23, and when the foldable screen 60 is unfolded, the film body 20 can extend from the accommodating cavity 101 in a direction perpendicular to the crease 23 to cover the foldable screen 60. The film body 20 may cover part or all of the foldable screen 60. Taking a direction of the plane of drawings of FIG. 1 and FIG. 3 as an example, the direction perpendicular to the crease 23 refers to a left-right direction of the plane of the drawings, and the crease 23 refers to extension in an up-down direction of the plane of the drawings. Generally, the crease 23 is typically located in the middle region of the foldable screen 60, schematically shown as a vertical line in FIG. 1 and FIG. 3. Similarly, it can be understood that, in an example of the disclosure, in order to clearly describe structures, features of each structure are shown as solid lines, but it is not indicated that the part is displayed in an actual product, and in order to ensure aesthetics of the product, the structure of each part may be arranged in a hidden or integrated manner.

According to one example of the present disclosure, arranging a film body 20 to cover the surface of a foldable screen 60 can protect the foldable screen 60; and arranging that the film body 20 may be partially retracted into a side accommodating cavity 101 can avoid that, the film body 20 located above the foldable screen 60 cannot be completely adapted to the curvature of the foldable screen 60 to bend when the foldable screen 60 is bent and folded, and thus avoiding damage to the foldable screen 60 caused by the protective film exerting pressure on the surface of the foldable screen 60 due to different curvatures of the protective film and the foldable screen. The protective film assembly in an example of the disclosure can be well adapted to the application of the foldable screen 60, which brings more feasibility to the use and development of the foldable screen 60.

In an example of the disclosure, the film body 20 may be configured to be a radiation prevention film, a frosted film, a high transmitting film, a film with mirror function, or a privacy film. Compared with a traditional screen, a foldable screen has many unusual features. Generally, the foldable screen is a large screen with a size up to 8.01 inches, so that the screen content can be displayed to a greater extent compared with the traditional screen, and the content displayed by the large screen can be easily seen by the people on the side. Thus, for a large-screen foldable screen, a higher level of privacy is asked. And by arranging the privacy film, which is adapted to make information displayed on the screen only for the user to read from the front and anyone watching from a side can only see a black screen, can help a user to effectively prevent information leakage during using the foldable screen, and reduce possibility of a snoop by other people.

In an example of the disclosure, the film body 20 can be retracted and extended manually, that is, when the foldable screen 60 needs to be folded after being used, part or all of the film body 20 can be manually retracted into the accommodating cavity 101, then the folding operation of the foldable screen 60 is performed, and vice versa. In some examples, referring to FIG. 5, the protective film assembly further includes a motor 12 which is used to drive the film body 20 to retract into or extend out of the accommodating cavity 101. The motor 12 can be arranged in the fixing portion 10. A mechanical button can be arranged on a middle frame or a backplate of the terminal, the motor 12 is controlled by the mechanical button, or the motor 12 may be controlled by a virtual button on a touch screen, so that the film body 20 is controlled to retract and extend. By using a motor 12-driven manner, the protective film assembly and the foldable screen 60 can be prevented from being scratched or damaged due to improper use of force during manual operation.

Referring to FIG. 1, the back of the terminal may be arranged with a wireless charging coil 30, which may be used to wirelessly charge the terminal, and on the other hand, the motor 12 may be electrically coupled to the wireless charging coil 30, so that the wireless charging coil 30 can supply power to the motor 12. By properly using structures inside the terminal, a utilization rate of components can be maximized, and the number of components in the terminal can be reduced as much as possible.

Figure 5:
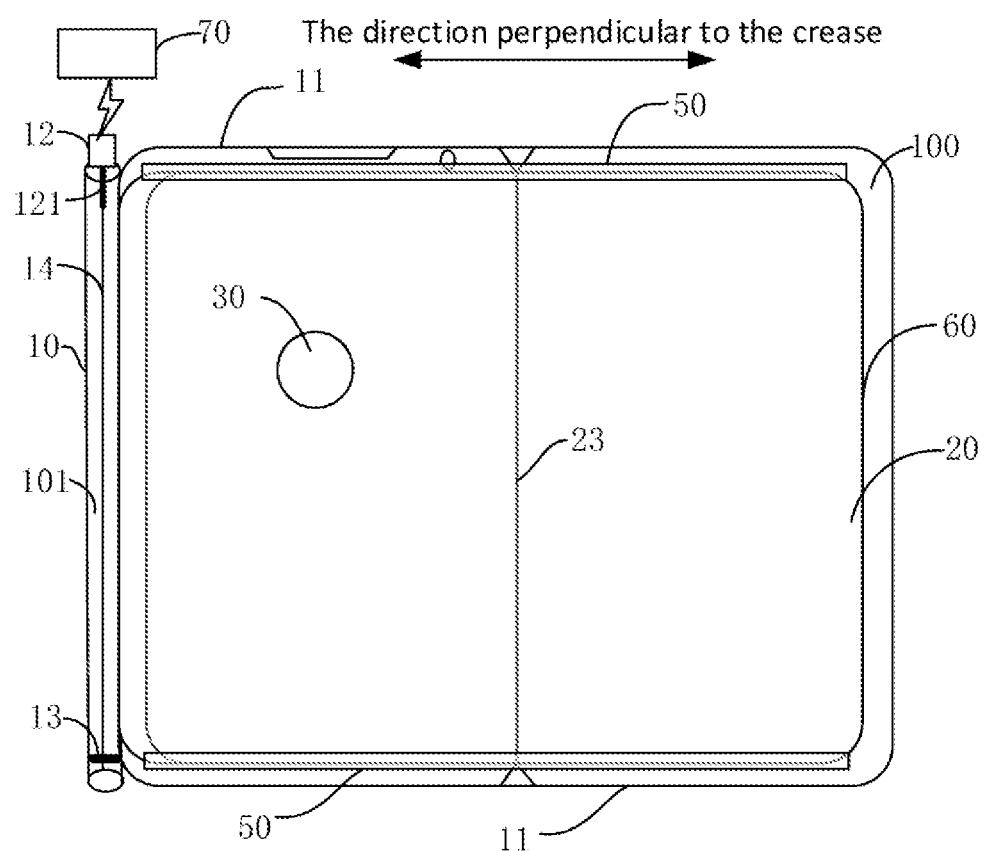
FIG. 5 is a schematic structural diagram of a foldable screen when unfolded according to an example.

In some examples, referring to FIG. 5, a sliding rail 13 for guiding a film body 20 to retract or extend may be arranged in the accommodating cavity 101. For example, the sliding rail may be arranged at a position corresponding to the film body 20 at both ends of the accommodating cavity 101. For example, the sliding rail 13 is a sliding slot, an edge of the film body 20 can be inserted into the sliding slot to slide. By arranging a sliding rail structure, a guiding effect can be achieved when the film body 20 retracts or extends, so that the film body 20 can be stored regularly when retracted, and the film body 20 can be aligned with an edge of a foldable screen 60 when extended, thus ensuring a protection effect and aesthetics.

Referring to FIG. 5, a rotating shaft 14 for winding and retracting the film body 20 is provided in the accommodating cavity 101 to reduce an occupied space of the retracted film body 20. When the protective film assembly includes the motor 12, an output shaft 121 of the motor 12 can be coaxially connected to the rotating shaft 14 to drive the rotating shaft 14 to rotate by means of rotation of the output shaft 121. An edge of the film body 20 close to a fixing portion 10 may be connected to the rotating shaft 14 in a bonding or embedding manner to make the film body 20 to move synchronously by means of rotation of the roating shaft. In an example of the disclosure, the accommodating cavity 101 may be configured as a cylindrical cavity to match the film body 20 wound by the rotating shaft 14, and winding of the film body 20 can be guided conveniently through the inner wall of the accommodating cavity 101.

In some examples, the film body 20 is rotatably connected to the fixing portion 10 so as to be close to or away from a foldable screen 60 in a rotatable manner. The rotatable manner may be achieved by means of the rotating shaft 14 or by flexibility of the film body 20. When the foldable screen 60 is unfolded, a user may determine whether to use the film body 20 according to needs. The user may retract the foldable screen 60 into the accommodating cavity 101 when the film body 20 is not needed. When it is desired that the film body 20 be removed during use, the user can uncover the film body 20 by means of turning, thus eliminating a step of retracting the film body 20. Here, taking FIG. 1 as an example to illustrate, the manner in which the film body 20 is uncover may be to rotate the film body 20 around the left side to rotate towards the outside of a plane of the drawing. With regard to a terminal having the foldable screen 60, referring to FIG. 2 and FIG. 4, after the foldable screen 60 is folded, usually the outer side is further arranged with an outer screen 70, and the protection to the outer screen 70 can be achieved by attaching a protective film. In an example of the disclosure, the protection to the outer screen 70 can further be achieved by turning the film body 20 of the foldable screen 60 to the outer screen 70, so as to achieve a dual use of one film, thus saving costs.

Figure 3:
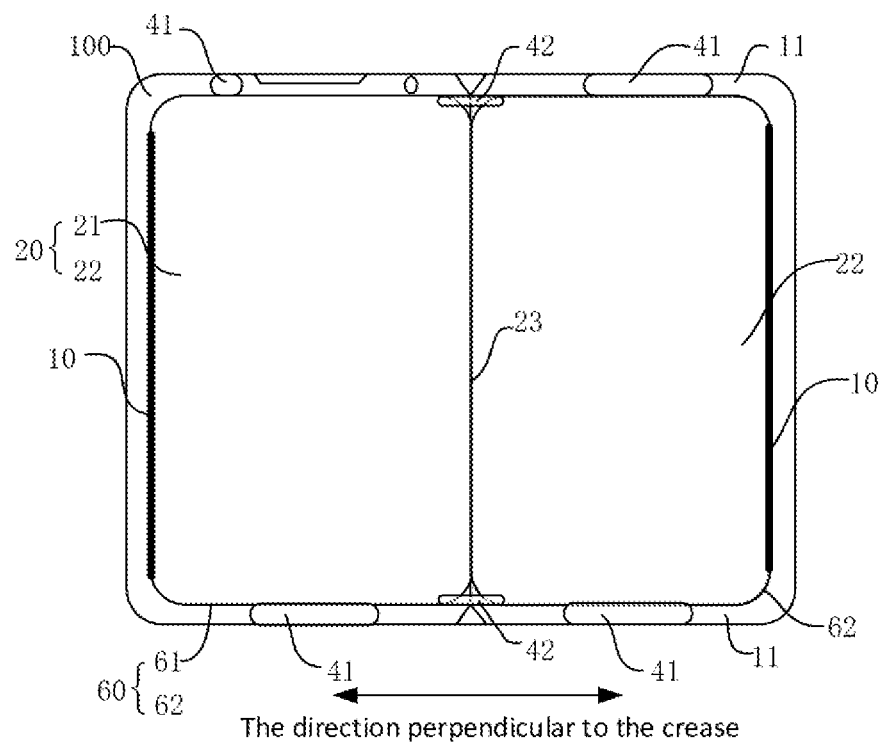
FIG. 3 is a schematic structural diagram of a foldable screen when unfolded according to an example.
Figure 4:
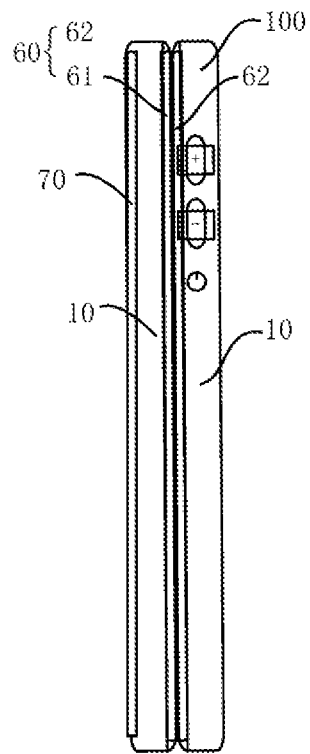
FIG. 4 is a schematic structural diagram of a foldable screen when folded according to the example shown in FIG. 3.

Referring to FIG. 1 and FIG. 3, the protective film assembly may further include two frame portions 11 matchingly arranged at two sides of the foldable screen 60 adjacent to the fixing portion 10, that is, two frame portions 11 are arranged at two sides of the foldable screen 60 in a direction of the crease 23. Taking a direction of the plane of the drawing of FIG. 1 as an example, the two frame portions 11 are arranged on the upper side and the lower side of the foldable screen 60. The frame portion 11 may be integrated with the fixing portion 10 to protect the terminal. Additionally, when the fixing portion 10 is arranged at only one side, an opposite side may also be arranged with an integral frame portion 11, so as to protect a terminal device in an entire circumferential direction.

Referring to FIG. 3, the two frame portions 11 each may be arranged with a first magnetic attraction group 41. The first magnetic attraction group 41 is respectively arranged on the upper side and the lower side of the film body 20 shown in the plane of the drawing, so that the film body 20 is magnetically attracted and positioned between the two frame portions 11. The first magnetic attraction group 41 may include a magnet arranged on the frame portion 11 and a magnetic member arranged on the film body 20 corresponding to the magnet. When the film body 20 covers the surface of the foldable screen 60, a position of the film body 20 relative to the foldable screen 60 may be positioned by means of magnetic attraction, so as to ensure that the film body 20 is well aligned with the foldable screen 60.

In some examples, referring to FIG. 1, the two frame portions 11 each may be arranged with a guiding slot 50, and the guiding slot 50 may extend in a direction (i.e., a left-right direction of the plane of the drawing) perpendicular to the crease 23 for corresponding insertion of two edges of the film body 20. The end of the film body 20 away from the fixing portion 10 may always be inserted into the guiding slot 50, so as to ensure that the retraction and extension of the film body 20 can completely move in a guiding direction of the guiding slot 50, thus achieving an effect of positioning the film body 20. In an example of the disclosure, a positioning manner of the film body 20 may be to use one of the first magnetic attraction group 41 and the guiding slot 50, or may be to use a combination of the first magnetic attraction group 41 and the guiding slot 50. The disclosure does not limit the positioning manner.

In an example of the disclosure, the protective film assembly may further include a controlling portion 70 for controlling the action of the film body 20. The controlling portion 70 may be a central processing unit provided inside the terminal. In FIG. 5, controlling portion 70 is shown in a visible manner for clarity. In practical applications, the control unit 70 may be hidden and disposed inside the terminal. When the motor 12 is provided, the controlling portion 70 may be electrically connected to the motor 12 to control the film body 20 by controlling the action of the motor 12, and when the film body 20 is driven by another means, for example, when being driven by means of a coil and a magnet, the controlling portion 70 may be electrically connected to a corresponding driving mechanism. The controlling portion 70 may be configured to control the film body 20 to retract into the accommodating cavity 101 when the foldable screen 60 starts to fold and control the film body 20 to extend out of the accommodating cavity 101 when the foldable screen 60 starts to unfold. For example, a sensor (such as a position sensor or an angle sensor) may be used to identify whether the foldable screen 60 starts to unfold or fold, or the controlling portion 70 may be used to identify whether a user triggers the screen to unfold or fold by a touch button or the like, and then the controlling portion 70 correspondingly controls the action of the film body 20. In the manner of automatically controlling by the controlling portion 70, hands of the user are freed, manual operation is not asked, and user experience is improved; and in such manner, damage to components caused by a misoperation or a missed operation that is easily caused by manual operation is avoided.

In some examples, the controlling portion 70 is configured to control the retraction of the film body at least away from a bending region of the foldable screen 60 when the foldable screen 60 starts to fold. That is, it is ensured that the film body 20 cannot bend at the foldable screen 60, and it is avoided that the curvature of the film body 20 cannot be well adapted to the curvature of the bending region of the foldable screen 60 and cause pressure on the screen, so that the screen is prevented from being damaged. The bending region of the folded screen 60 refers to the region where the folded screen 60 is bent at the crease 23.

In some examples, the controlling portion 70 is configured to control the film body 20 to retract to be completely separated from the foldable screen 60 when the foldable screen 60 starts to fold, in this manner, when the foldable screen 60 is folded, it is avoided that the film body 20 does not fully retract so that part of the foldable screen 60 may have contact and friction with the outer surface of the film body 20, so as to avoid damage or scratches on the surface of the foldable screen 60 when there are particles on the outer surface of the film body 20.

In some examples, the controlling portion 70 may be configured to control the film body 20 to stop the retraction action in response to determining that the bending of the film body 20 is dectected during the folding process of the foldable screen 60. When a user quickly folds the foldable screen 60, the controlling portion 70 cannot timely control the film body 20 to retract to a desired position. The desired position refers to the position of the film body 20 away from the bending region of the folded screen 60. That is, when the film body 20 is not away from the bending region of the foldable screen 60, the foldable screen 60 has been bent, and the film body 20 is also bent. In this case, even if the film body 20 does not retract in place, the controlling portion 70 immediately controls the film body 20 to stop retraction. The reason is that the continuous retraction action will cause the bent film body 20 to cause further damage to the foldable screen 60 having a different curvature from the curvature of the film body 20. Therefore, this controlling manner can minimize the damage to the foldable screen 60.

In some examples, the controlling portion 70 may be configured to: control the film body 20 to stop the retraction action when the foldable screen 60 is folded fully. Similarly, when the foldable screen 60 is folded fully and the film body 20 is not retracted due to a quick operation of the user, no matter whether the film body 20 is bent or not, the controlling portion 70 immediately controls the film body 20 to stop the retraction action. On the one hand, it is avoided that the moving film body 20 scratches the folded screen, and on the other hand, it is avoided that user experience is affected due to actions still performed after the terminal device is folded.

In an example of the disclosure, the controlling portion 70 may control the film body 20 to extend after the foldable screen 60 is unfolded fully, or when the foldable screen 60 starts to unfold as described above. When the latter is adopted, an extension speed of the film body 20 may be controlled to be lower than a unfolding speed of the foldable screen 60, thus avoiding that the film body 20 covers the bending region of the foldable screen 60 in a bending state of the foldable screen 60, so as to avoid damage to the screen.

Referring to FIG. 3, in an example of the disclosure, the film body 20 may include a first sub-film 21 for covering a first screen 61 of the foldable screen 60 and a second sub-film 22 for covering a second screen 62 of the foldable screen 60, the first sub-film 21 and the second sub-film 22 are respectively connected to opposite sides of the first screen 61 and the second screen 62 by means of the fixing portion 10. That is, the left side and right side of the plane of the drawing each are arranged with the fixing portion 10, and the two sub-films are close to or away from each other as the foldable screen 60 unfolds or folds.

Continuing to refer to FIG. 3, a second magnetic attraction group 42 may be arranged on the first sub-film 21 and the second sub-film 22 to magnetically attract the first sub-film 21 and the second sub-film 22 to connect when the foldable screen 60 is unfolded. The second magnetic attraction group 42 may ensure that the two sub-films can be stably connected together, and can be separated from each other when the foldable screen is folded. The structural form of the second magnetic attraction group 42 may be the same as the structural form of the first magnetic attraction group 41. Taking a direction of the plane of drawings of FIG. 3 as an example, the second magnetic attraction groups 42 may be arranged on the upper side and the lower side of the two sub-films respectively, so as to ensure that a display effect of the film body 20 is not affected, and to ensure the connection stability. When the foldable screen 60 is folded, a mechanism used for driving the foldable screen 60 to fold pushes a position where the two sub-films are connected, so that the two sub-films can be forced to be separated, and the sub-films can be further pushed into the accommodating cavity 101 by the pushing force. Disposing the film body 20 in a form of two sub-films may reduce a movement distance of each sub-film when the sub-film retracts or extends, and may improve the efficiency of retraction or extension in the same time as compared with an integral film body 20.

In some examples, referring to FIG. 1, the film body 20 may be configured to be an integral film connected to one side of the foldable screen 60 by means of the fixing portion 10, and the integral film can cover the entire foldable screen 60. Compared with the sub-film, the integral film omits connection structure between the two sub-films, may ensure an overall visual effect, enhances the aesthetics, and improves user experience.

According to an example of the disclosure, a protective shell is further provided, referring to FIG. 1, the protective shell includes an housing 100 for coating the periphery of a frame of a terminal and the protective film assembly as described above. The protective shell has all beneficial effects of the protective film assembly, and here details are not described again. The protective shell may be covered at the periphery of the terminal, and the fixing portion 10 may be arranged on one side or two opposite sides of the housing 100 according to a composition form of the film body 20, or one or both sides of the housing 100 are configured as the fixing portion 10. The manner of arranging the protective film assembly on the protective shell may intergrate two components, so that multiple functions can be achieved by means of one component, the number of accessories of the terminal is reduced, and the user can conveniently manage the terminal.

According to an example of the disclosure, a terminal is further provided, which may include the folded screen and the protective film assembly as described above. The terminal has all beneficial effects of the protective film assembly, and here details are not described again. A middle frame of the terminal may be configured with the fixing portion 10, and the film body 20 may be connected to the fixing portion 10 in a detachable manner, so as to facilitate a replacement of the film body 20. The terminal may be a mobile phone or a tablet computer, etc.

It would be easy for those skilled in the art to conceive of another example of the disclosure upon consideration of the specification and practice of the disclosure. The disclosure is intended to cover any variation, use, or adaptation of the disclosure, and these variations, uses, or adaptations follow the general principles of the disclosure and include common general knowledge or customary technical means in the art that are not disclosed in the disclosure. The specification and examples are considered as examples only, and the true scope and spirit of the disclosure is indicated by the following claims.

The disclosure is not limited to the precise structures described above and illustrated in the accompanying drawings, and that various modifications and changes may be made without departing from the scope of the disclosure. The scope of the disclosure is subject to the appended claims.

Additional non-limiting embodiments of the disclosure include:

A first embodiment includes a protective film assembly for a foldable screen, including: a fixing portion, for being disposed at a side edge of a terminal parallel to a crease of the foldable screen; and a film body, for covering the foldable screen, an accommodating cavity is inside the fixing portion, and the film body is configured to retract into the accommodating cavity in a direction perpendicular to the crease at least partially in case that the foldable screen is folded, and to extend out of the accommodating cavity in a direction perpendicular to the crease to cover the foldable screen in case that the foldable screen is unfolded.

A second embodiment includes the protective film assembly of embodiment 1, the protective film assembly further includes a motor for driving the film body to retract into or extend out of the accommodating cavity.

A third embodiment includes the protective film assembly of embodiment 2, the motor is electrically coupled with a wireless charging coil in the terminal.

A fourth embodiment includes the protective film assembly of embodiments 1-3, a sliding rail for guiding the film body to retract or extend is in the accommodating cavity.

A fifth embodiment includes the protective film assembly of embodiments 1-4, a rotating shaft for winding the film body is in the accommodating cavity.

A sixth embodiment includes the protective film assembly of embodiments 1-5, the film body is rotatably connected to the fixing portion to make the film body close to or away from the foldable screen in a rotating manner.

A seventh embodiment includes the protective film assembly of embodiments 1-6, the protective film assembly further includes two frame portions at two sides of the foldable screen in a direction of the crease in match with the foldable screen.

A eighth embodiment includes the protective film assembly of embodiment 7, a first magnetic attraction group, for magnetically attracting and positioning the film body between the two frame portions, is at each of the two frame portions.

A ninth embodiment includes the protective film assembly of embodiments 7 and 8, a guiding slot, for corresponding insertion of two edges of the film body, is at each of the two frame portions.

A tenth embodiment includes the protective film assembly of embodiments 1-9, the protective film assembly further includes a controlling portion for controlling the film body, the controlling portion is configured to control the retraction of the film body into the accommodating cavity in case that the foldable screen starts to fold, and to control the extension of the film body out of the accommodating cavity in case that the foldable screen starts to unfold.

A eleventh embodiment includes the protective film assembly of embodiment 10, the controlling portion is configured to control the retraction of the film body at least away from a bending region of the foldable screen in case that the foldable screen starts to fold.

A twelfth embodiment includes the protective film assembly of embodiment 10, the controlling portion is configured to control the retraction of the film body to be completely separated from the foldable screen in case that the foldable screen starts to fold.

A thirteenth embodiment includes the protective film assembly of embodiment 10, the controlling portion is configured to stop the retraction of the film body in response to determining that a bending of the film body is detected during the folding process of the foldable screen.

A fourteenth embodiment includes the protective film assembly of embodiment 10, the controlling portion is configured to stop the retraction of the film body in case that the foldable screen is folded fully.

A fifteenth embodiment includes the protective film assembly of embodiments 1-14, the film body is a privacy film.

A sixteenth embodiment includes the protective film assembly of embodiments 1-16, the film body includes a first sub-film for covering a first screen of the foldable screen and a second sub-film for covering a second screen of the foldable screen, the first sub-film and the second sub-film are respectively connected to opposite sides of the first screen and the second screen by means of the fixing portion.

A seventeenth embodiment includes the protective film assembly of embodiment 16, a second magnetic attraction group, for magnetically attracting the first sub-film and the second sub-film to connect with each other in case that the foldable screen is unfolded, is on the first sub-film and the second sub-film.

A eighteenth embodiment includes the protective film assembly of embodiments 1-15, the film body is configured to be an integral film for covering the entire foldable screen, the integral film is connected to one side of the foldable screen by means of the fixing portion.

A nineteenth embodiment includes a protective shell, including an housing for coating the periphery of a frame of a terminal and a protective film assembly of embodiments 1-18, a fixing portion is on at least one side of the housing, or at least one side of the housing is configured to be the fixing portion.

A twentieth embodiment includes a terminal, including the protective film assembly of embodiments 1-18.

What is claimed is:

1. A protective film assembly for a foldable screen, comprising:
   a fixing portion, wherein the fixing portion is disposed at a side edge of a terminal, and the side edge is parallel to a crease of the foldable screen; and
   a film body covering the foldable screen,
   wherein an accommodating cavity is disposed inside the fixing portion, and the film body is configured to at least partially retract into the accommodating cavity in a direction perpendicular to the crease in case that the foldable screen is folded, and to extend out of the accommodating cavity in the direction perpendicular to the crease to cover the foldable screen in case that the foldable screen is unfolded.

2. The protective film assembly according to claim 1, wherein the protective film assembly further comprises a motor for driving the film body to retract into or extend out of the accommodating cavity.

3. The protective film assembly according to claim 2, wherein the motor is electrically coupled with a wireless charging coil in the terminal.

4. The protective film assembly according to claim 1, wherein a sliding rail for guiding the film body to retract or extend is in the accommodating cavity.

5. The protective film assembly according to claim 1, wherein a rotating shaft for winding the film body is in the accommodating cavity.

6. The protective film assembly according to claim 1, wherein the film body is rotatably connected to the fixing portion to make the film body close to or away from the foldable screen in a rotating manner.

7. The protective film assembly according to claim 1, wherein the protective film assembly further comprises two frame portions at two sides of the foldable screen in a direction of the crease in match with the foldable screen.

8. The protective film assembly according to claim 7, further comprising: a first magnetic attraction group disposed at each of the two frame portions, for magnetically attracting and positioning the film body between the two frame portions.

9. The protective film assembly according to claim 7, wherein a guiding slot, for corresponding insertion of two edges of the film body, is disposed at each of the two frame portions.

10. The protective film assembly according to claim 1, wherein the protective film assembly further comprises a controlling portion for controlling the film body, wherein the controlling portion is configured to control the retraction of the film body into the accommodating cavity in case that the foldable screen starts to fold, and to control the extension of the film body out of the accommodating cavity in case that the foldable screen starts to unfold.

11. The protective film assembly according to claim 10, wherein the controlling portion is configured to control the retraction of the film body at least away from a bending region of the foldable screen in case that the foldable screen starts to fold.

12. The protective film assembly according to claim 10, wherein the controlling portion is configured to control the retraction of the film body to be completely separated from the foldable screen in case that the foldable screen starts to fold.

13. The protective film assembly according to claim 10, wherein the controlling portion is configured to stop the retraction of the film body in response to determining that a bending of the film body is detected during the folding process of the foldable screen.

14. The protective film assembly according to claim 10, wherein the controlling portion is configured to stop the retraction of the film body in case that the foldable screen is folded fully.

15. The protective film assembly according to claim 1, wherein the film body is a privacy film.

16. The protective film assembly according to claim 1, wherein the film body comprises a first sub-film for covering a first screen of the foldable screen and a second sub-film for covering a second screen of the foldable screen, wherein the first sub-film and the second sub-film are respectively connected to opposite sides of the first screen and the second screen by means of the fixing portion.

17. The protective film assembly according to claim 16, wherein a second magnetic attraction group, for magnetically attracting the first sub-film and the second sub-film to connect with each other in case that the foldable screen is unfolded, is disposed on the first sub-film and the second sub-film.

18. The protective film assembly according to claim 1, wherein the film body is configured to be an integral film for covering the entire foldable screen, wherein the integral film is connected to one side of the foldable screen by means of the fixing portion.

19. A protective shell, comprising an housing for coating the periphery of a frame of a terminal and a protective film assembly for a foldable screen, the protective film assembly comprises:
 a fixing portion, wherein the fixing portion is disposed at a side edge of a terminal, and the side edge is parallel to a crease of the foldable screen; and
 a film body, for covering the foldable screen,
 wherein an accommodating cavity is disposed inside the fixing portion, and the film body is configured to at least partially retract into the accommodating cavity in a direction perpendicular to the crease in case that the foldable screen is folded, and to extend out of the accommodating cavity in the direction perpendicular to the crease to cover the foldable screen in case that the foldable screen is unfolded,
 wherein a fixing portion is disposed on at least one side of the housing, or at least one side of the housing is configured to be the fixing portion.

20. A terminal, comprising the protective film assembly for a foldable screen, the protective film assembly comprises:
 a fixing portion, wherein the fixing portion is disposed at a side edge of a terminal, and the side edge is parallel to a crease of the foldable screen; and
 a film body, for covering the foldable screen,
 wherein an accommodating cavity is disposed inside the fixing portion, and the film body is configured to at least partially retract into the accommodating cavity in a direction perpendicular to the crease in case that the foldable screen is folded, and to extend out of the accommodating cavity in the direction perpendicular to the crease to cover the foldable screen in case that the foldable screen is unfolded.

* * * * *